(12) United States Patent
Nibe et al.

(10) Patent No.: US 6,188,296 B1
(45) Date of Patent: Feb. 13, 2001

(54) LOCAL OSCILLATOR HAVING IMPROVED OSCILLATION CHARACTERISTIC

(75) Inventors: Masayuki Nibe, Yao; Masahiro Kato, Nagakakyo, both of (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/359,119

(22) Filed: Jul. 23, 1999

(30) Foreign Application Priority Data

Jul. 23, 1998 (JP) .................................... 10-207521
May 10, 1999 (JP) .................................... 11-128439

(51) Int. Cl.[7] .................................... H03B 5/00
(52) U.S. Cl. .................. 331/117 D; 331/117 FE
(58) Field of Search ................ 330/117 D, 117 FE, 330/117 R, 96, 99, 185

(56) References Cited

U.S. PATENT DOCUMENTS 4,707,669 * 11/1987 Mekata et al. .................... 331/99
4,713,632 * 12/1987 Nishikawa et al. ............. 331/117 D
4,906,946 * 3/1990 Mekata et al. .................... 331/99
5,708,397 * 1/1998 Furutani et al. ............... 331/107 SL

FOREIGN PATENT DOCUMENTS 2134720  11/1990  (JP) .
 514059  1/1993  (JP) .

* cited by examiner

*Primary Examiner*—Robert Pascal
*Assistant Examiner*—Henry Choe

(57) ABSTRACT

A local oscillator has the following construction so that easier design can be achieved, stable oscillation characteristic can be provided and the manufacturing cost can be reduced. A high impedance line, a ground pattern with a through hole, and a coupling line are formed on a printed circuit board. A chip part, such as HEMT, and a dielectric resonator are mounted thereon by die bonding. A terminal of HEMT is connected to the pattern formed on the printed circuit board by wire bonding. A drain terminal of the HEMT is connected to a bias circuit. The bias circuit includes a stub for grounding, a high impedance line, and a chip capacitor.

18 Claims, 15 Drawing Sheets

DC POWER SUPPLY

LOCAL OSCILLATOR HAVING IMPROVED OSCILLATION CHARACTERISTIC

BACKGROUND OF THE INVENTION

1. Field of the Invention

The present invention relates generally to local oscillators, and more particularly, to a dielectric oscillator for use in an antenna unit (Low Noise Block downconverter, hereinafter referred to as "LNB") for receiving signals in the Ku band or higher frequency bands (such as Ka band).

2. Description of the Background Art

The Ku band about in the range of receiving frequencies from 10 GHz to 13 GHz has been used for satellite broadcasting and satellite communication. A typical Ku band satellite broadcasting receiving system will be now described in conjunction with accompanying drawings, where the same reference characters represent the same or corresponding portions.

Referring to FIG. 11, the Ku band satellite broadcasting receiving system is divided into an outdoor part 200 and an indoor part 210. Outdoor part 200 includes an antenna 201 and an LNB 202 connected thereto, while indoor part 210 includes an indoor receiver 204 and a television set 209. LNB 202 amplifies an electric wave received from antenna 201 with reduced noise and supplies a signal at a sufficient level with a low noise to indoor receiver 204 connected through a coaxial cable 203. Indoor receiver 204 includes a DBS tuner 205, an FM demodulator 206, a video and audio circuit 207 and an RF modulator 208. A signal applied to indoor receiver 204 through coaxial cable 203 from LNB 202 is processed by these circuits and applied to television set 209.

As a typical Ku band receiver LNB, a domestic CS receiving LNB will be now described. Referring to FIG. 12, an incoming signal at an input frequency in the range from 12.2 GHz to 12.75 GHz is received at an antenna probe 251 in a waveguide, amplified by a low noise amplifying circuit herein after simply as "LNA") 252 with reduced noise, and then passed through a band pass filter (hereinafter simply as "BPF") 253. BPF 253 allows a desired frequency band to pass therethrough in order to remove a signal in an image frequency band.

A signal passed through BPF 253 is input to a mixing circuit (hereinafter MIX 254 together with an oscillation signal of 11.2 GHz from a local oscillator (LO) 256, and frequency-converted into a signal in an intermediate frequency band from 1000 to 1550 MHz at MIX 254. The resultant signal is amplified by an intermediate frequency amplifying circuit (hereinafter as "IF AMP") 257 to have appropriate noise and gain characteristics and output from an output terminal 261. A power supply 258 is a power supply to provide electric power to LNA 252, IF AMP 257 and local oscillator 256.

In the Ku band satellite broadcasting receiving system as described above, local oscillator 256 used in LNB 202 is a critical part which determines the performance of LNB 202. A dielectric resonator oscillator (DRO) generally called a drain ground band reflective type dielectric oscillator is used as local oscillator 256.

Meanwhile, satellite broadcasting and communication are planned to be realized using the Ka band about in the range of receiving frequencies from 16 GHz to 24 GHz.

Referring to FIG. 13, the Ka band satellite broadcasting receiving system planned to be used for domestic COMETS is divided into an outdoor part 300 and an indoor part 310. Outdoor part 300 includes an antenna 301 and an LNB 302 connected thereto. Indoor part 310 includes an indoor receiver 304 and a terminal 308. LNB 302 amplifies a very small electric wave received at antenna 301 with reduced noise and supplies a signal at a sufficient level with reduced noise to indoor receiver 304 connected through coaxial cable 303. Indoor receiver 304 demodulates a signal input from LNB 302 using DBS tuner 305 and FM demodulator 306, and decodes data with decoder 307 for transmission to terminal 308. Terminal 308 can be for example, a so-called digital processing device such as personal computer, television set, modem and FAX.

Referring to FIG. 14, in the Ka band receiving LNB, an incoming signal at an input frequency in the range from 20.4 GHz to 21.0 GHz is received at an antenna probe 351 in a waveguide, amplified with reduced noise at an LNA 352, and then removed of images at a BPF 353. A signal passed through BPF 353 is input to an MIX 354 together with an oscillation signal at a frequency of 18.7 GHz from a local oscillator 355. The resultant signal is frequency-converted at MIX 354 into a signal in an intermediate frequency band from 1700 MHz to 2300 MHz. The signal is then amplified by an IF AMP 357 and output from an output terminal 361. A power supply 358 is a power supply to provide electric power to LNA 352, IF AMP 357 and local oscillator 356.

As a local oscillator used for receiving the Ka band can be a circuit as shown in FIG. 15. Referring to FIG. 15, the Ka band local oscillator includes an FET401 and a dielectric resonator 402. The gate terminal G of FET 401 is connected in series with a coupling line 403 and a 50Ω-terminal chip resistor 404, the other end of which is connected to ground.

The drain terminal D of FET 401 is connected to a DC power supply 414 and a capacitor 405 for grounding, the other end of which is connected to ground.

The source terminal S of FET 401 is connected to an output matching stub 406, the other end of which is connected to a coupling capacitor 407 and an inductance 408. The inductance 408 is further connected to a capacitor 409 for grounding and a chip resistor 410 for grounding, connected in parallel to the other end of inductance 408. The other ends of capacitor 409 for grounding and chip resistor 410 for grounding, are connected to ground.

The oscillation characteristics of the Ka band local oscillator such as power, frequency temperature drift, phase noise and load fluctuation are optimized depending upon the distance between dielectric resonator 402 and coupling line 403, the distance between dielectric resonator 402 and FET 401, and the width and length of output matching stub 406 provided at source terminal S.

The Ka or Ku band local oscillator is particularly difficult and costly to manufacture. This is because the circuit designing does not allow much flexibility and is difficult in optimizing the oscillation characteristic. In addition, substrate patterns cannot be readily changed as practiced according to conventional techniques in response to improvement in the oscillation characteristics derived from change in design.

SUMMARY OF THE INVENTION

The present invention is directed to a solution to the above-described problems, and it is one object of the present invention is to provide a local oscillator easy to be manufactured with reduced cost and capable of exhibiting stable oscillation characteristic.

Another object of the present invention is to provide a local oscillator capable of readily changing oscillation characteristic if the design is changed.

In order to achieve the above objects, a local oscillator according to one aspect of the present invention includes an oscillation element, a bias circuit having one end connected to a power supply and the other end connected to a drain terminal of the oscillation element, and a printed circuit board on which the oscillation element and the bias circuit are provided, and the bias circuit includes a first stub for grounding, a high impedance line and a chip capacitor.

According to the present invention, the circuit of a local oscillator can be formed on a single printed circuit board sheet, which reduces assembling operation, and a local oscillator with reduced manufacturing cost can be provided. Furthermore, a local oscillator having stable oscillation characteristics can be provided.

According to another aspect of the present invention, the local oscillator includes an oscillation element and a bias circuit having one end connected to a power supply and the other end connected to the drain terminal of the oscillation element, and the bias circuit includes a U-shaped pattern impedance line.

According to the present invention, a local oscillator whose oscillation characteristic can be readily improved by changing the design is provided.

According to yet another aspect of the present invention, an antenna unit has a local oscillator which includes an oscillation element, a bias circuit having one end connected to a power supply and the other end connected to a drain terminal of the oscillation element, and a printed circuit board on which the oscillation element and the bias circuit are provided, and the bias circuit includes a stub for grounding, a high impedance line and a chip capacitor.

According to the present invention, the circuit of an antenna unit can be formed on a single printed circuit board sheet, which reduces the assembling operation and the manufacturing cost. An antenna unit having stable oscillation characteristic can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
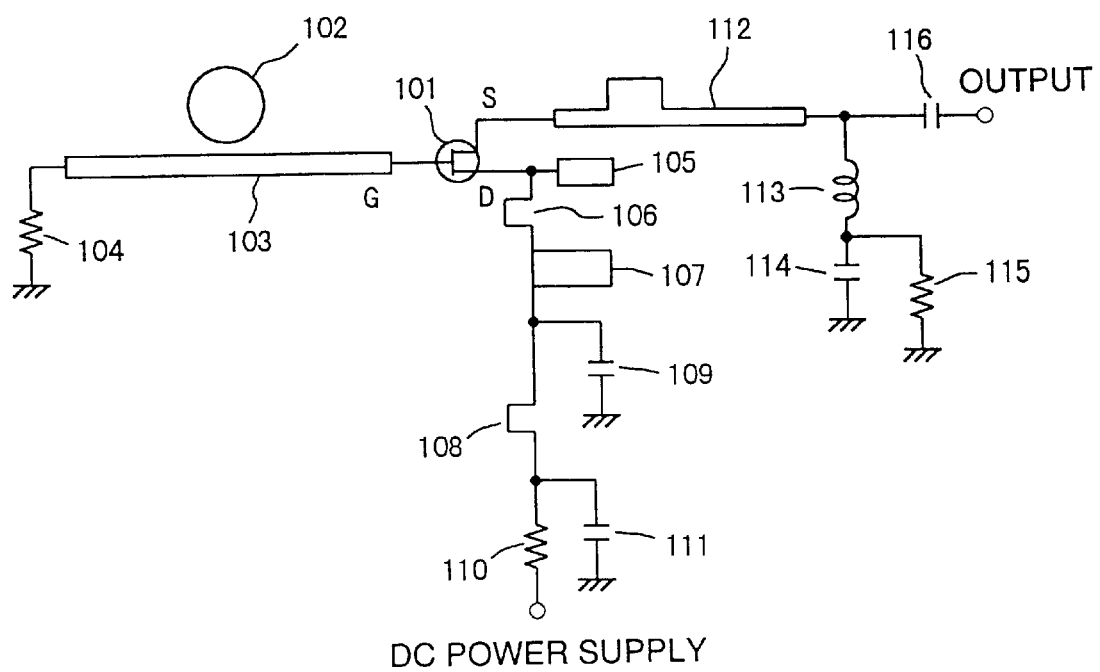
FIG. 1 is a circuit diagram of a local oscillator according to a first embodiment of the present invention.

A local oscillator according to an embodiment of the present invention will be now described in conjunction with the accompanying drawings in which the same reference characters denote the same or corresponding portions.

Referring to FIG. 1, a local oscillator for the Ka band includes a High Electron Mobility Transistor (hereinafter as HEMT) 101 and a dielectric resonator 102. HEMT 101 has a gate terminal G connected to coupling line 103 and a 50Ω-terminal chip resistor 104, the other end of which is connected to ground.

HEMT 101 has a drain terminal D connected to a stub 105 for grounding drain and a high impedance line 106 for blocking high frequency component. The other end of the high impedance line 106 for blocking high frequency component, is connected to an open stub 107 for grounding high frequency component and a chip capacitor 109 for grounding, and a high impedance line 108 for blocking high frequency component. The other end of the high frequency impedance line 108 is connected to a DC bias chip resistor 110 and a chip capacitor 111 for grounding. The other end of chip capacitor 111 for grounding, is connected to ground; and DC bias chip resistor 110 has its other end connected to a DC power supply.

HEMT 101 has a source terminal S connected to an output matching stub 112, the other end of which is connected to coupling capacitor 116 and high impedance line 113 for blocking high frequency component. The other end of the high impedance line 113 is connected in parallel to a chip capacitor 114 for grounding and a DC bias chip resistor 115. The other ends of chip capacitor 114 and DC bias chip resistor 115 are connected to ground.

Figure 2:
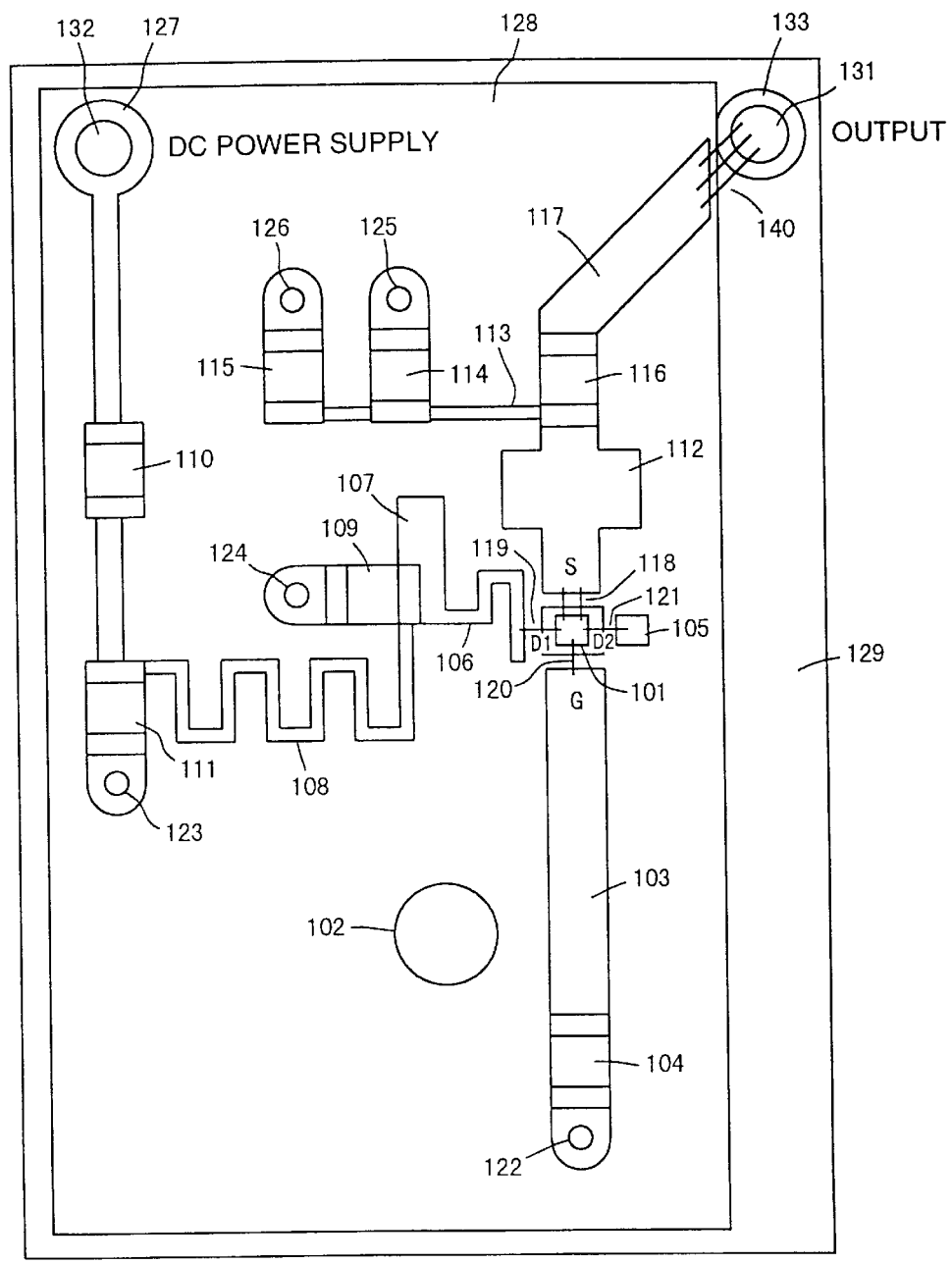
FIG. 2 is a circuit pattern diagram of the local oscillator according to the first embodiment.

Referring to FIG. 2, in the local oscillator, a printed circuit board 128 is mounted on a conductive stem 129. Mounted on printed circuit board 128 are bare chip HEMT 101, chip resistors 104, 115 and 110, chip capacitors 109, 111, 114 and 116, and a dielectric resonator 102. Further formed on printed circuit board 128 are a coupling line 103, stubs 105, 107 and 112, and high impedance lines 106, 108 and 113. In addition, ground patterns 122 to 126 with a through hole for grounding are formed, 50Ω-terminal chip resistor 104, chip capacitor 111 for grounding, chip capacitor 109 for grounding, chip capacitor 114 for grounding, and DC bias chip resistor 115 are connected to ground patterns 122 to 126, respectively and grounded. The output terminal 131 of the local oscillator passes through stem 129, and there is a dielectric 133 provided between output terminal 131 and stem 129 for insulation. One end of a microstrip line 117 formed on printed circuit board 128 and output terminal 131 are connected by a wire 140. Meanwhile, a power supply terminal 132 is connected to a pattern 127 with a through hole formed on printed circuit board 128.

HEMT 101 has two drain terminals, one drain terminal D1 is connected to high impedance line 106 for blocking high frequency component by a wire 119, while the other drain terminal D2 is connected to stub 105 for grounding by a wire 121. Gate terminal G is connected to coupling line 103 by a wire 120 and source terminal S is connected to output matching stub 112 by a wire 118.

In the circuit of the thus formed local oscillator, bare chip HEMT 101 has two drain terminals D1 and D2, drain D1 is supplied with DC current through DC bias chip resistor 110, high impedance line 108, open stub 107 for grounding high frequency component and high impedance line 106 for blocking high frequency component. Meanwhile, a high frequency component is grounded by stub 105 for grounding drain connected to drain terminal D2.

Oscillation power is output to output terminal 131 from source terminal S through output matching stub 112 and coupling chip capacitor 116.

An open stub may be provided at both drain terminals D1 and D2 for blocking high frequency component. If such an open stub is provided in the bias circuit, however, the frequency band which could be effectively grounded by the open stub is narrow and therefore it is difficult to completely block high frequency component coming into the bias circuit. Furthermore, a blocking pattern, a high impedance line and other open stubs or chip capacitors must be used to cover the frequency band which cannot be grounded by the open stub. The optimization therefore should be simultaneously performed with optimization of a drain grounding pattern to prevent parasitic oscillation.

The local oscillator according to this embodiment permits the bias circuit side of a drain terminal to be in an open state, and on the other drain side, only the open stub is used for grounding high frequency component. As a result, in the bias circuit, blocking of the parasitic oscillation or the like can be considered without optimizing the pattern of the drain grounding.

In the local oscillator according to this embodiment, dielectric resonator 102 is provided together and flush with other circuit parts such as chip resistor and chip capacitor on printed circuit board 128 using an automatic mounter. HEMT 101, an oscillation element is, die-bonded on the board in the bare chip state, and each terminal is connected to the pattern on the board by wire bonding.

Dielectric resonator 102 is secured with an adhesive at a position where the distance from the gate terminal G of HEMT 101 and the distance from coupling 103 connected to gate terminal G are optimum. The adhesive used herein is selected such that it causes less high frequency loss and can be applied and cured in the same process as the other parts.

Oscillation characteristics of the local oscillator such as power, frequency temperature drift, phase noise and load fluctuation are optimized by adjusting the distance between dielectric resonator 102 and coupling line 103, the distance between dielectric resonator 102 and HEMT 101, the width and length of stub 105 for drain grounding and the width and length of output matching stub 112 provided at source terminal S.

Figure 3:
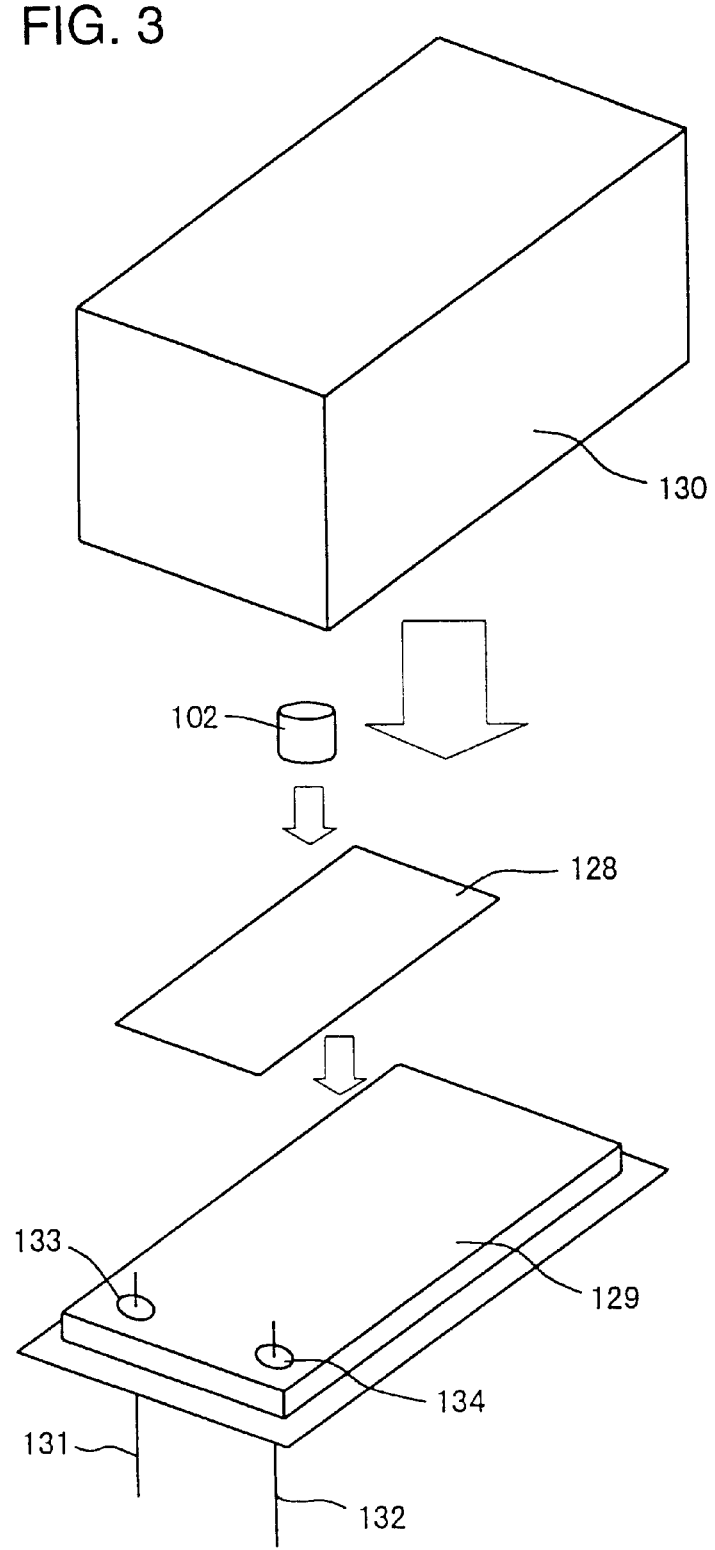
FIG. 3 is a view of the local oscillator according to the first embodiment.

Referring to FIG. 3, the local oscillator has a so-called can structure, and dielectric resonator 102 and chip parts (not shown) are mounted on printed circuit board 128. The oscillation elements are die-bonded on the same board, and each terminal of the oscillation elements is connected by wire bonding and mounted on stem 129. This is followed by welding a cover 130 for sealing.

As described above, the local oscillator according to this embodiment employs an HEMT having two drain terminals as an oscillation element, one drain terminal D2 is connected to stub 105 for drain grounding, the other drain terminal D1 is connected to a bias circuit to provide power supply, and stub 105 for drain grounding and the bias circuit to provide power supply are provided separately from one another. Thus, interference between stub 105 for drain grounding and the bias circuit can be reduced. Furthermore, optimization to block high frequency waves in the bias circuit such as pattern optimization of open stub 107 for grounding high frequency component can be considered independently from stub 105 for drain grounding.

Furthermore, the circuit of the local oscillator can be formed on a single printed circuit board. As a result, the assembling operation is alleviated, which can reduce the manufacturing cost.

Modification

A modification of the local oscillator according to the first embodiment will be now described.

Using a pattern for blocking a high frequency component, a high impedance line, an open stub and a chip capacitor in the above bias circuit, a high frequency component can be blocked as well as the pattern for drain grounding to prevent parasitic oscillation can be optimized.

Thus, when a high frequency component and parasitic oscillation can be prevented only with the bias circuit, the drain terminal D2 of HEMT 101 does not have to be connected to open stub 105. Therefore, an oscillation element HEMT having a single drain terminal can be used.

Figure 4:
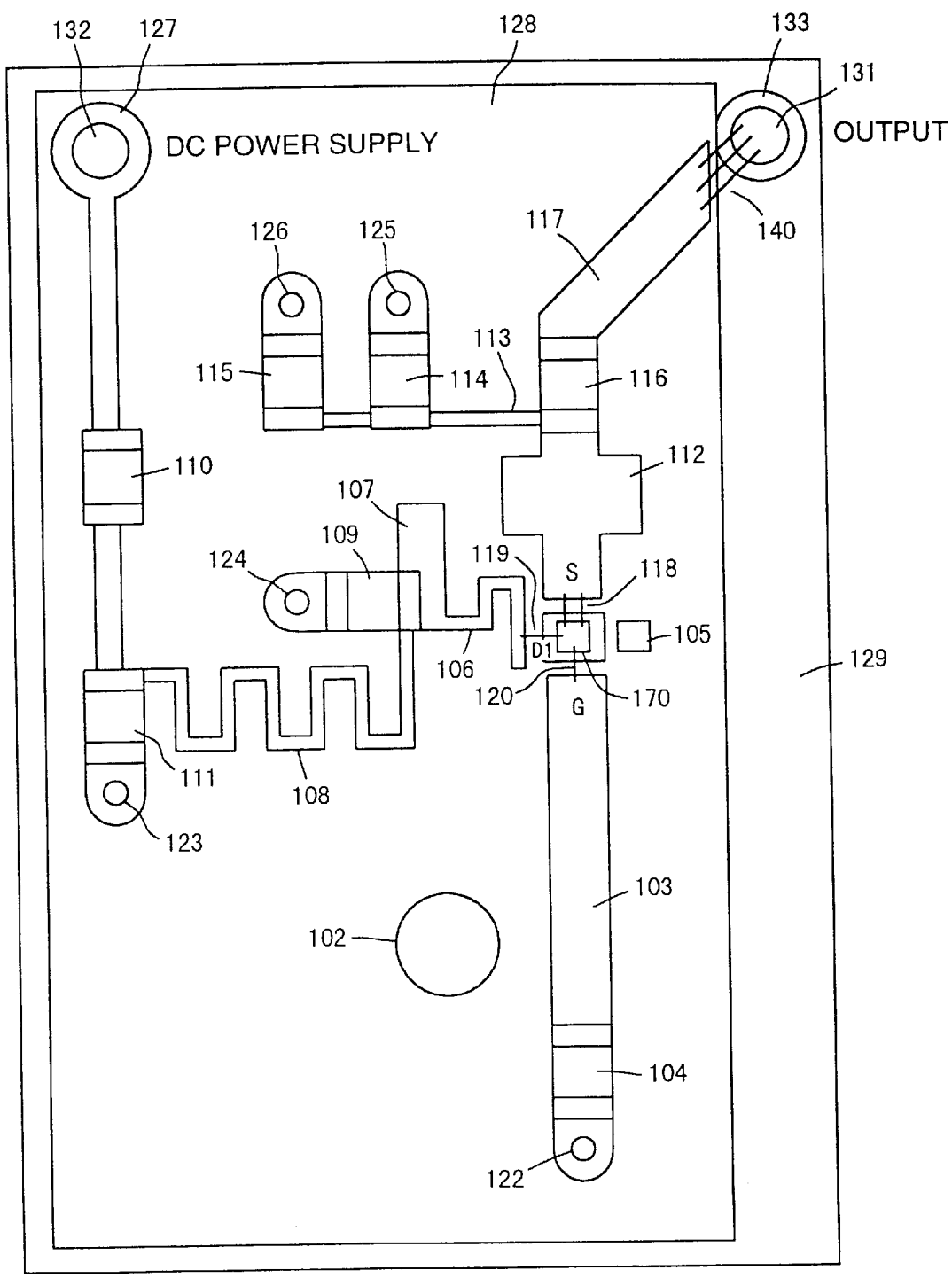
FIG. 4 is a modified circuit pattern diagram of the local oscillator according to the first embodiment using an HEMT having a single drain terminal.

In the modification of the local oscillator according to the first embodiment, HEMT 101 having two drain terminals is replaced with an HEMT 170 having a single drain terminal. The other structure is the same as that of the pattern shown in FIG. 2, and additional description is not provided herein. Referring to FIG. 4, the drain terminal D1 of HEMT 170 is connected to high impedance line 106 forming the bias circuit by wire 119, but is not connected to stub 105 for drain grounding. In this modification, in the bias circuit including high impedance line 106 for blocking high frequency component, open stub 107 for grounding high frequency component, chip capacitor 109 for grounding, high impedance line 108 for blocking high frequency component, DC bias chip resistor 110, and chip capacitor for grounding 111, a high frequency component is blocked and parasitic oscillation is prevented.

Thus, in the modification of the local oscillator, the high impedance line, the open stub and the chip capacitor are used in the bias circuit to block the high frequency component as well as to prevent parasitic oscillation, so that the drain terminal of HEMT 170 does not have to be connected to stub 105 for drain grounding, and an HEMT having a single drain terminal can be employed. Therefore, stable oscillation characteristics can be secured independently of the number of terminals for the drain, source and gate. In addition, since the HEMT can be selected independently of the number of terminals for the drain, source and gate, the manufacturing cost and assembling operation steps can be reduced.

Second Embodiment

Figure 5:
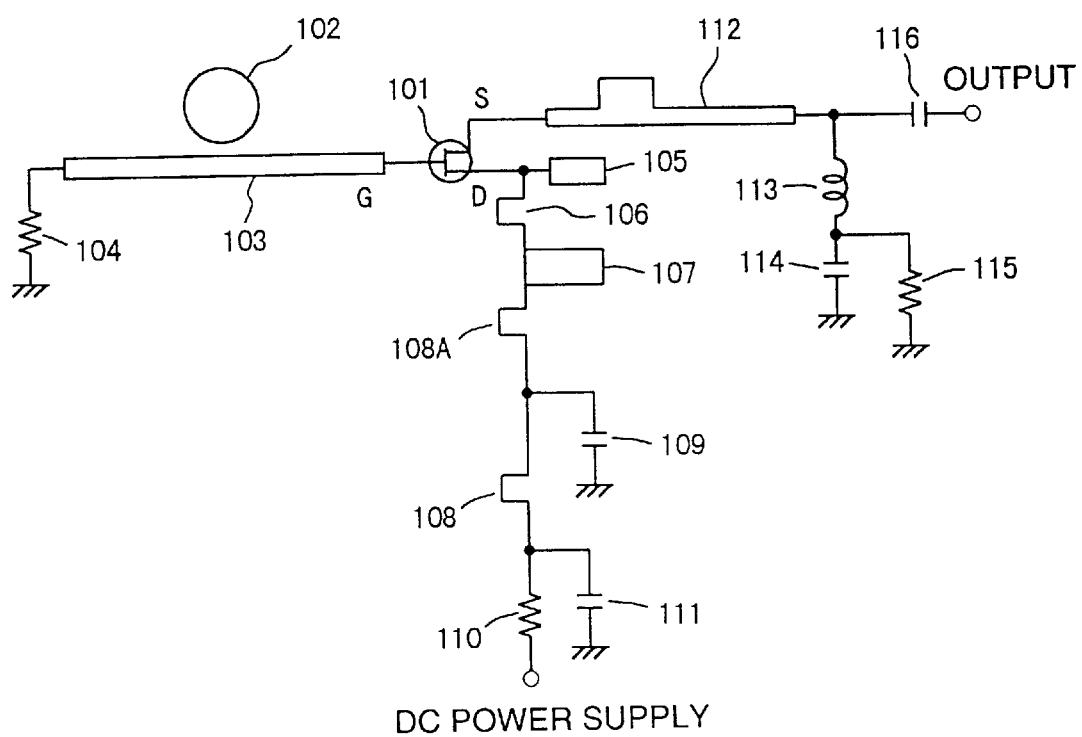
FIG. 5 is a circuit diagram of a local oscillator according to a second embodiment of the present invention.

A local oscillator according to a second embodiment of the present invention will be now described. Referring to FIG. 5, the circuit diagram is the same as that according to the first embodiment with the essential difference that a high impedance line 108A is provided between open stub 107 for grounding high frequency component and chip capacitor 109 for grounding, and therefore additional description is not provided herein.

Figure 6:
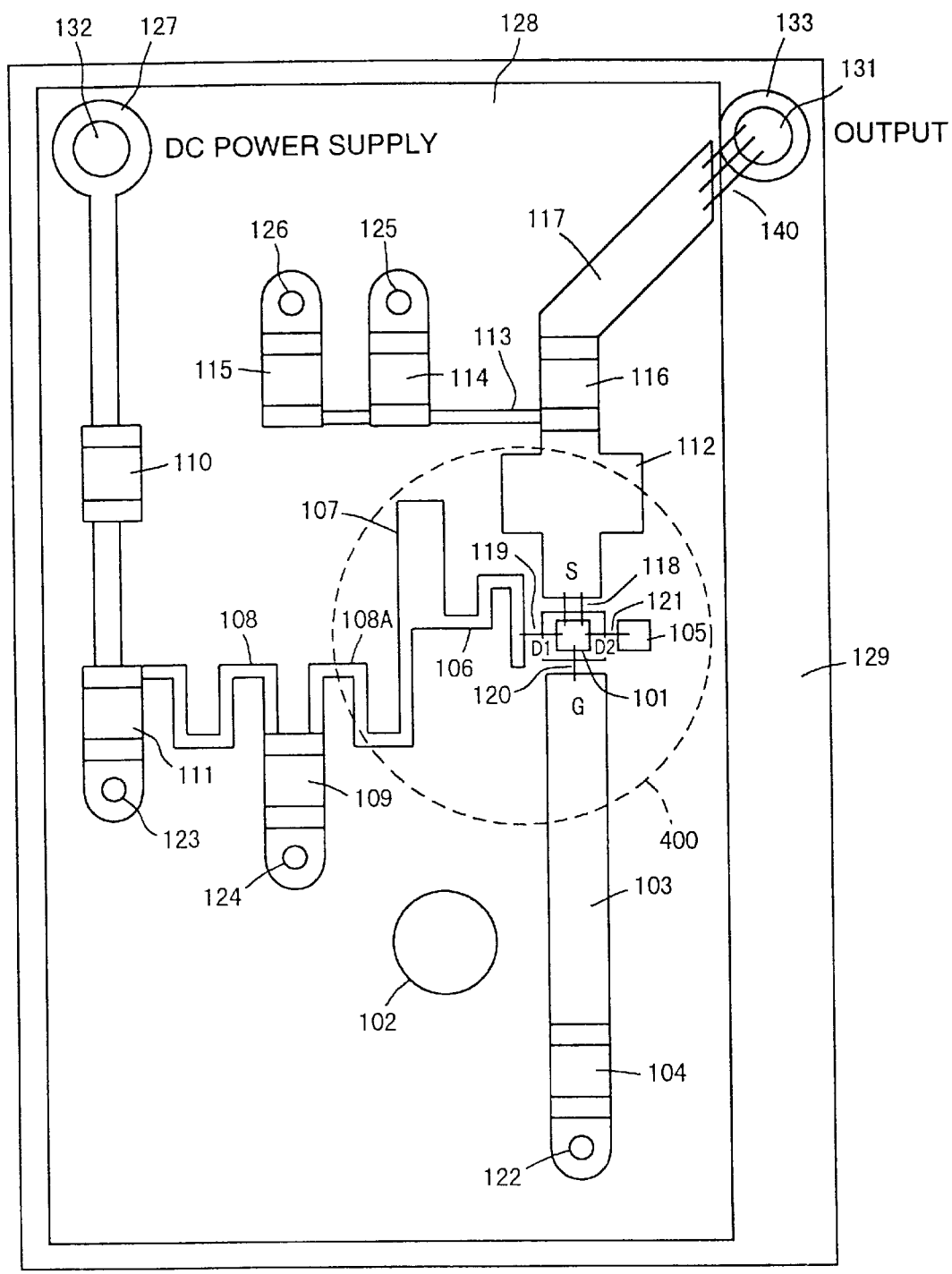
FIG. 6 is a circuit pattern diagram of the local oscillator according to the second embodiment.

Referring to FIG. 6, in the local oscillator according to the second I embodiment, chip capacitor 109 for grounding is not directly connected to open stub 107 for grounding high frequency component. Instead, high impedance line 108A for blocking high frequency component is connected between open stub 107 for grounding high frequency component and chip capacitor 109 for grounding.

Figure 7:
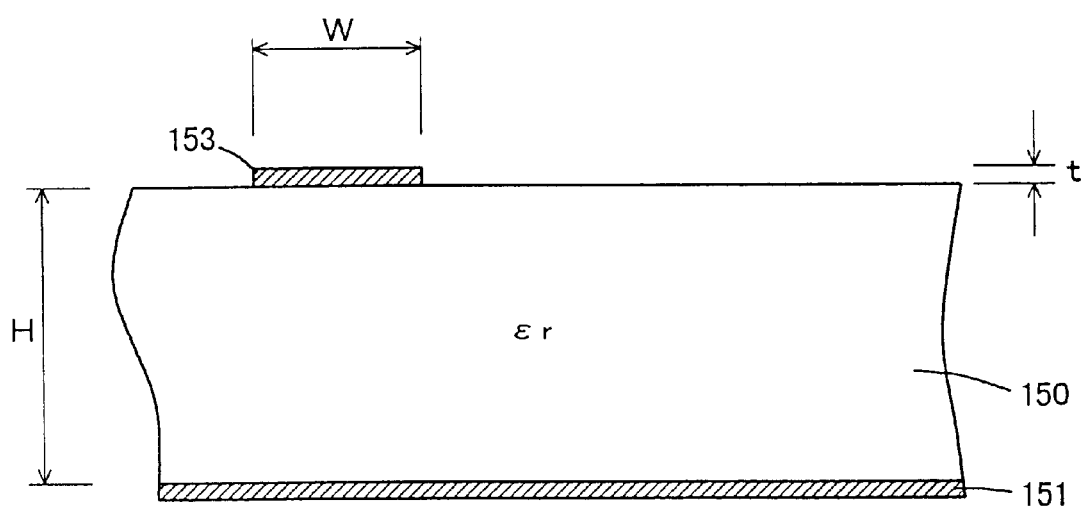
FIG. 7 is a cross sectional view of a ceramic substrate having a microstrip line on its top surface.

The high impedance line will be now described. A microstrip line which has an impedance of 50Ω at a signal frequency is typically used as a signal line (hereinafter referred to as "50Ω line"). The high impedance line refers to a microstrip line having an impedance relatively higher than this 50Ω line. FIG. 7 is a cross sectional view of a ceramic substrate having a microstrip line formed thereon. Ceramic substrate 150 have a conductor 151 formed thereunder as a ground surface, and microstrip line 153 formed thereon. If, for example, the dielectric constant of ceramic substrate 150, $\epsilon_r$=9.4, thickness H=0.38 mm, and the thickness of microstrip line 153, t=0.015 mm, the width of the 50Ω line, W=0.364 mm at a signal frequency, f=18.75 GHz. Meanwhile, if the line width of the high impedance line, W=0.2 mm, the characteristic impedance, $Z_o$=63.9Ω. This shows that the inductance component increases and the impedance should take a value higher than 50Ω as the line width of the microstrip line is smaller than the 50Ω line because the line has the same characteristic as a coil. The impedance increases as a function of the frequency.

In the above specific example, the Voltage Stable Wave Ratio (VSWR) between the high impedance line and the 50Ω line, ρ=1.28 and a signal at a frequency f=18.75 GHz is hardly allowed to pass the high impedance line.

Therefore, the high impedance line can block a high frequency signal at a particular frequency.

In this embodiment, in a bias circuit to supply power to the drain terminal D1 of oscillation element HEMT 101, chip capacitor for grounding 109 is connected to open stub 107 for grounding high frequency component through high impedance line 108A for blocking high frequency component, so that parasitic oscillation caused by feedback between drain terminal D1 and chip capacitor 109 for grounding can be restrained and a local oscillator with a stable oscillation characteristic is provided.

Modification

Also in the local oscillator according to the second embodiment, an HEMT with a single drain terminal can be employed. As described in connection with the first embodiment, this can be achieved by blocking high frequency component and preventing parasitic oscillation using a bias circuit. In a modification of the local oscillator according to the second embodiment, HEMT 101 having two drain terminals is replaced with an HEMT 170 having a single drain terminal. The other structure is the same as that shown in the pattern in FIG. 6, and additional description is not provided herein.

Figure 8:
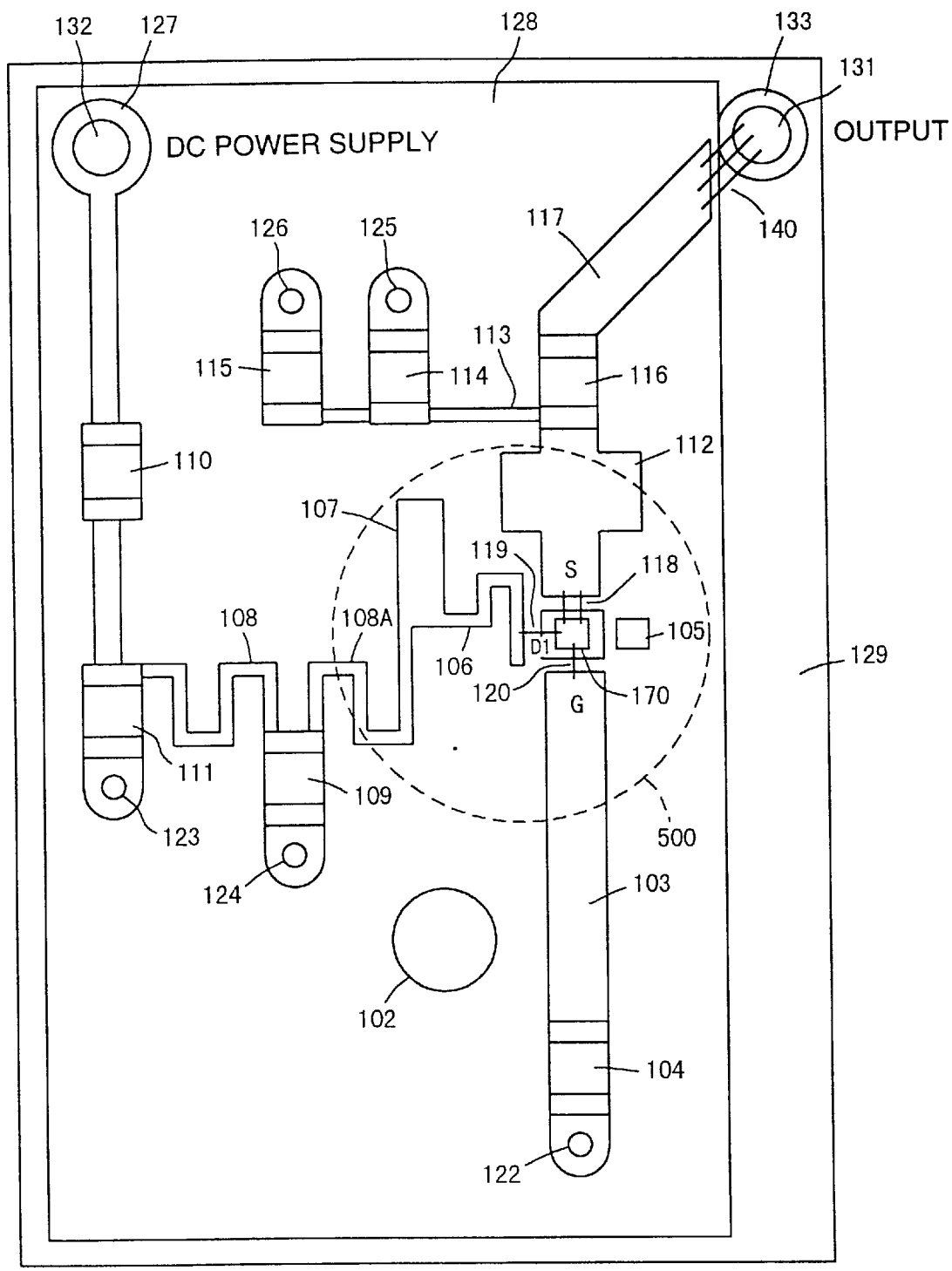
FIG. 8 is a modified circuit pattern diagram of the local oscillator according to the second embodiment using an HEMT having a single drain terminal.

As shown in FIG. 8, in the modification of the local oscillator according to the second embodiment, HEMT 170 having a single drain terminal is used, and stable oscillation characteristic can be obtained independently of the number of drain terminals of HEMT 170.

This is because the bias circuit connected to the drain terminal D1 of HEMT 170 includes a high impedance line 106 for blocking high frequency component, an open stub 107 for grounding high frequency component, a chip capacitor for grounding 109, high impedance lines 108, 108A for blocking high frequency component, a DC bias chip resistor 110, and a chip capacitor for grounding 111, so that high frequency component can be blocked and parasitic oscillation can be prevented. Since a high frequency component can be blocked and parasitic oscillation can be prevented, the drain terminal of HEMT 170 does not have to be connected to stub 105 for drain grounding.

As in the foregoing, the modification of the local oscillator according to the second embodiment can provide stable oscillation characteristic independently of the number of the drain terminals of the HEMT.

Third Embodiment

A local oscillator according to a third embodiment of the present invention will be now described. In the local oscillator according to the third embodiment, the circuit pattern of the local oscillator according to the second embodiment is corrected to improve the oscillation characteristic.

Figure 9:
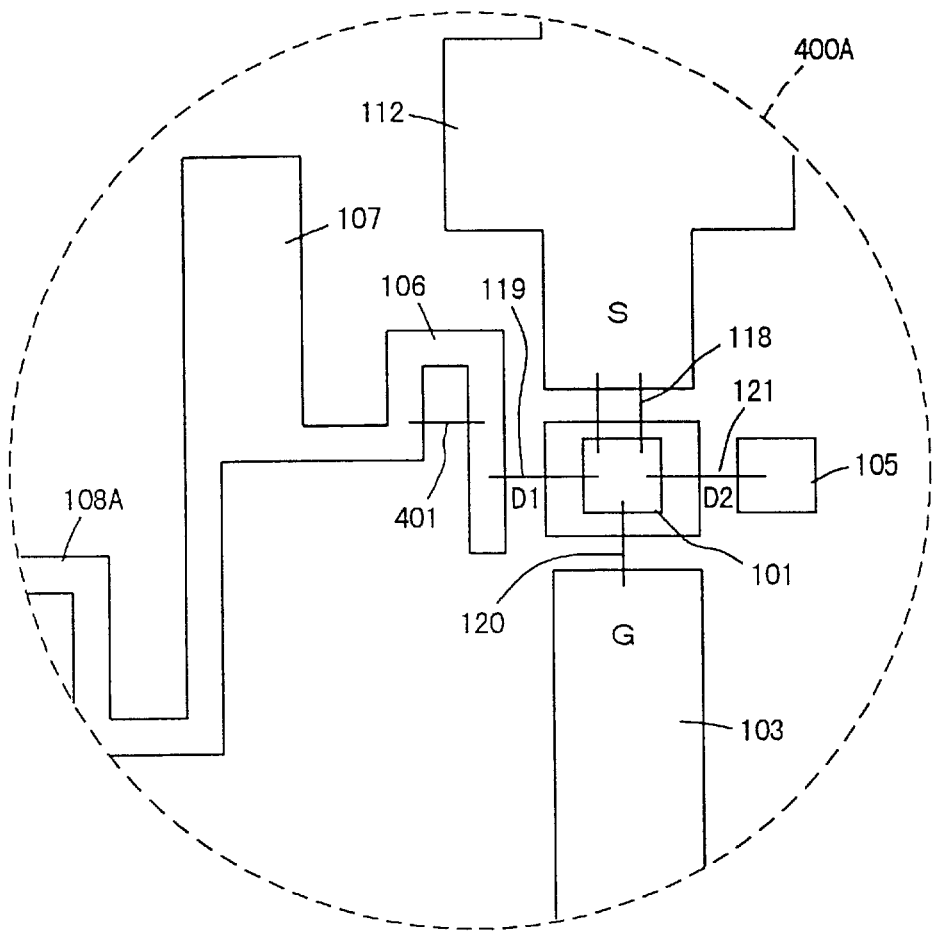
FIG. 9 is an enlarged diagram of a part according to a third embodiment of the present invention which corresponds to the part labeled 400 in FIG. 6.

Referring to FIG. 9, high impedance line 106 for blocking high frequency component has a U shape. A wire 401 connects two positions of high impedance line 106 for blocking high frequency component so as to cross the space surrounded by high impedance line 106.

Thus, the U shape of high impedance line 106 permits the two positions of the high impedance line 106 to be readily short-circuited. Therefore, the oscillation characteristic can be improved according to change in the design without correcting the circuit pattern. In addition, variations in the oscillation characteristic caused by variations in the manufacture can be readily adjusted.

Furthermore, the wire is bonded using a wire bonder and therefore, the connection position of the wire can be adjusted within the precision of the bonder. As a result, the oscillation characteristic can be adjusted at a precision at which the connecting position of the wire can be adjusted, in other words, higher precision adjustment can be enabled.

Modification

Figure 10:
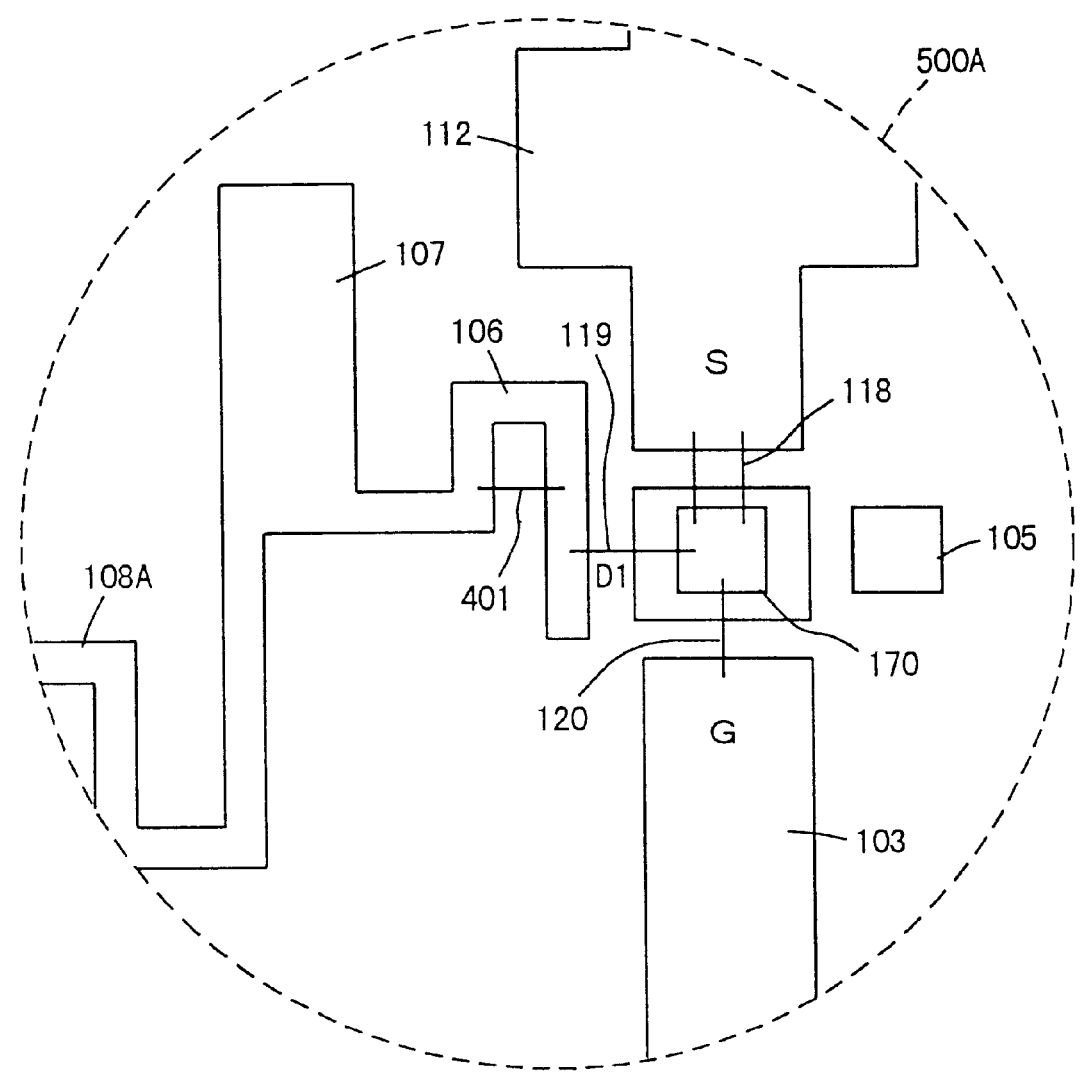
FIG. 10 is an enlarged diagram of a part of a modification of the third embodiment which corresponds to a part labeled 500 in FIG. 8.
Figure 11:
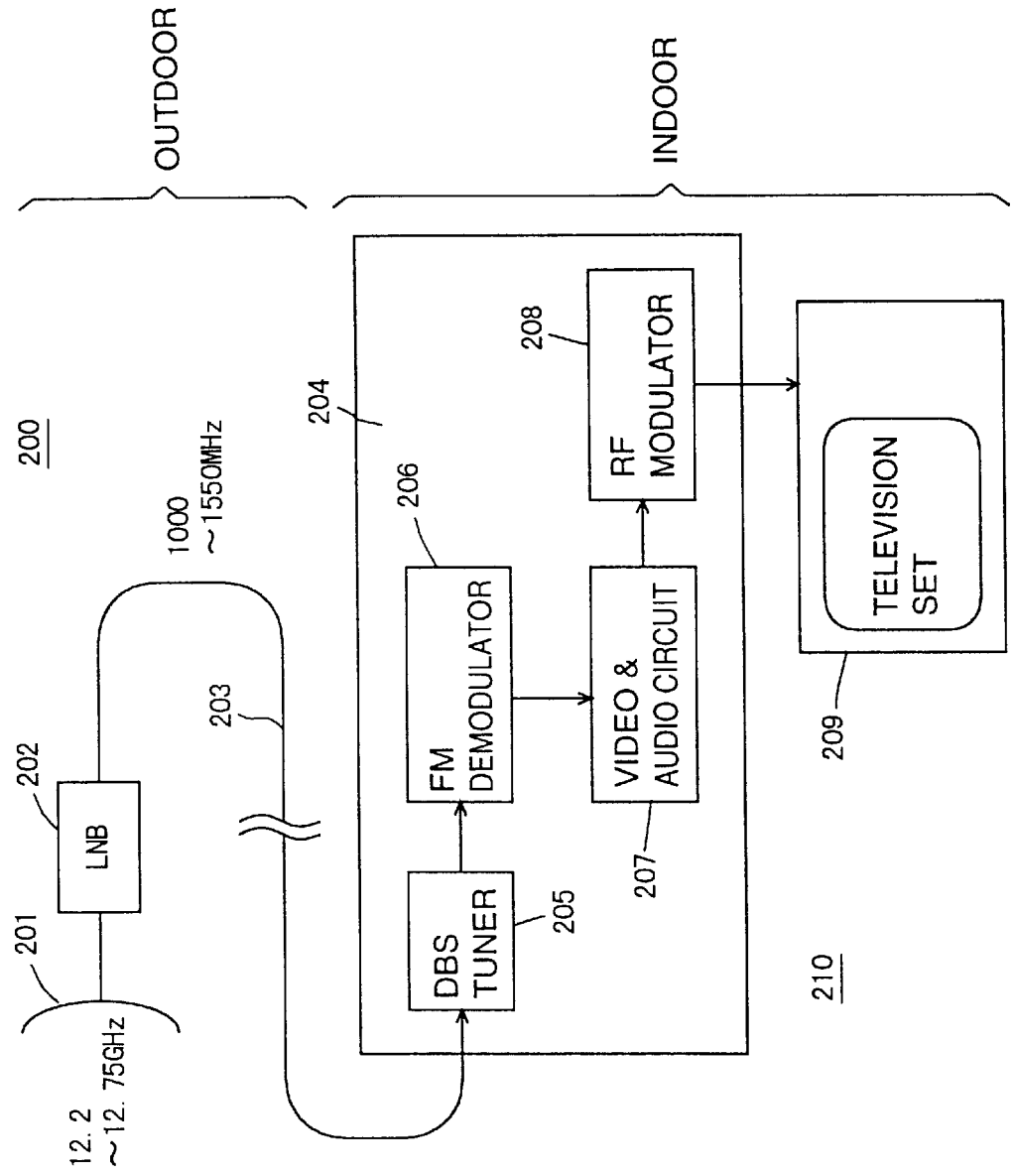
FIG. 11 is a schematic block diagram of the Ku band satellite broadcasting receiving system.
Figure 12:
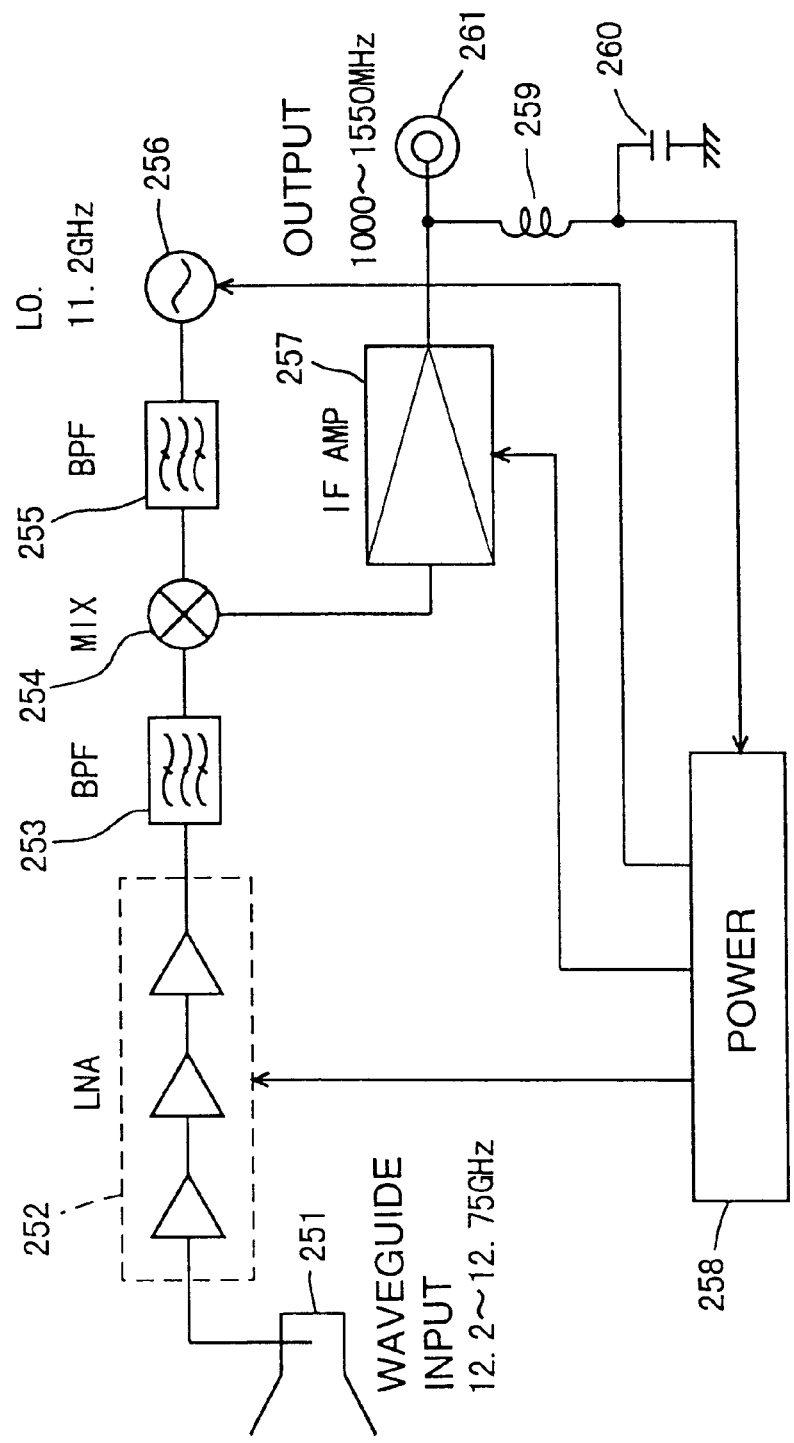
FIG. 12 is a schematic circuit block diagram of an LNB for receiving the Ku band.
Figure 13:
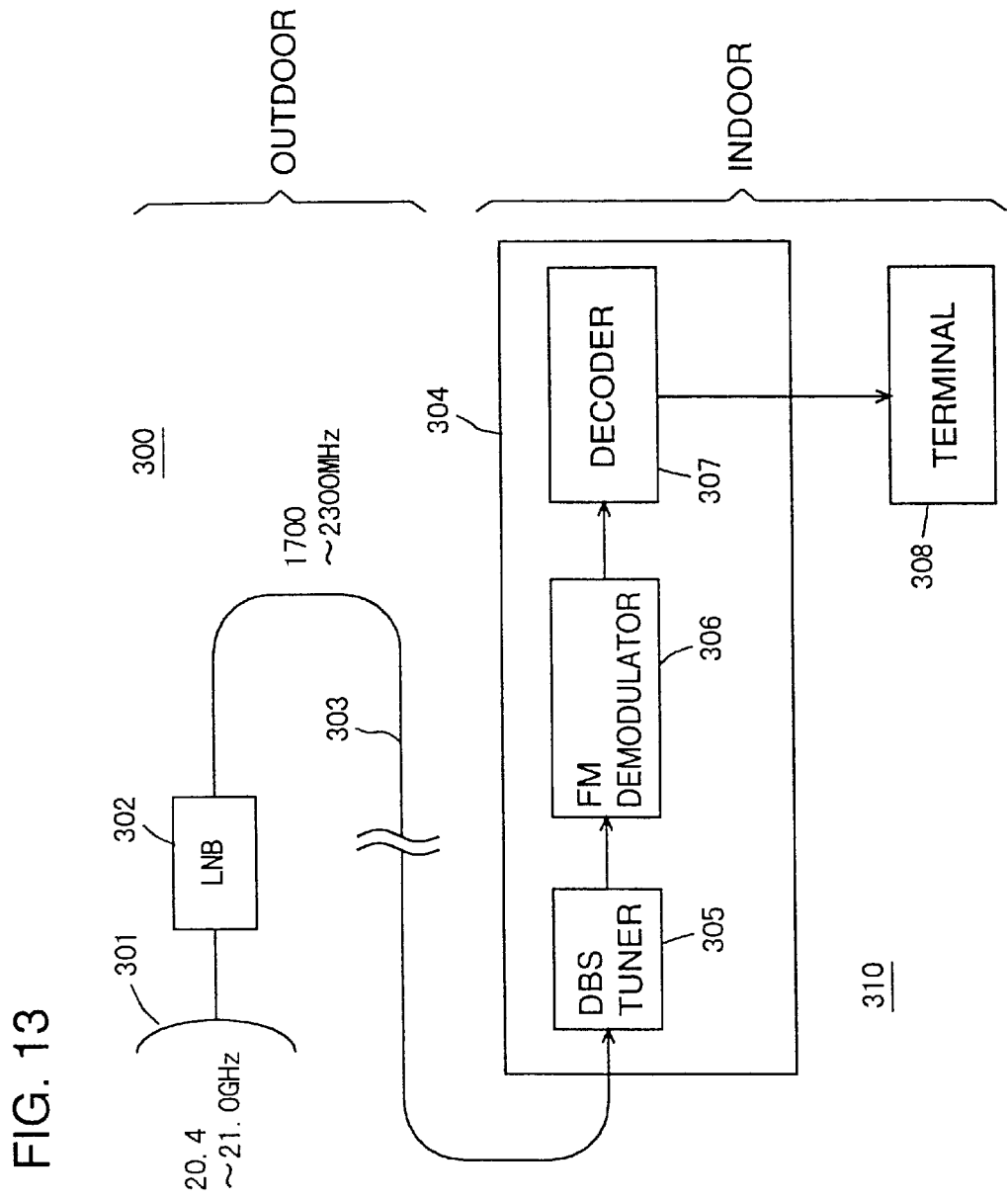
FIG. 13 is a schematic block diagram of Ka band satellite broadcasting receiving system.
Figure 14:
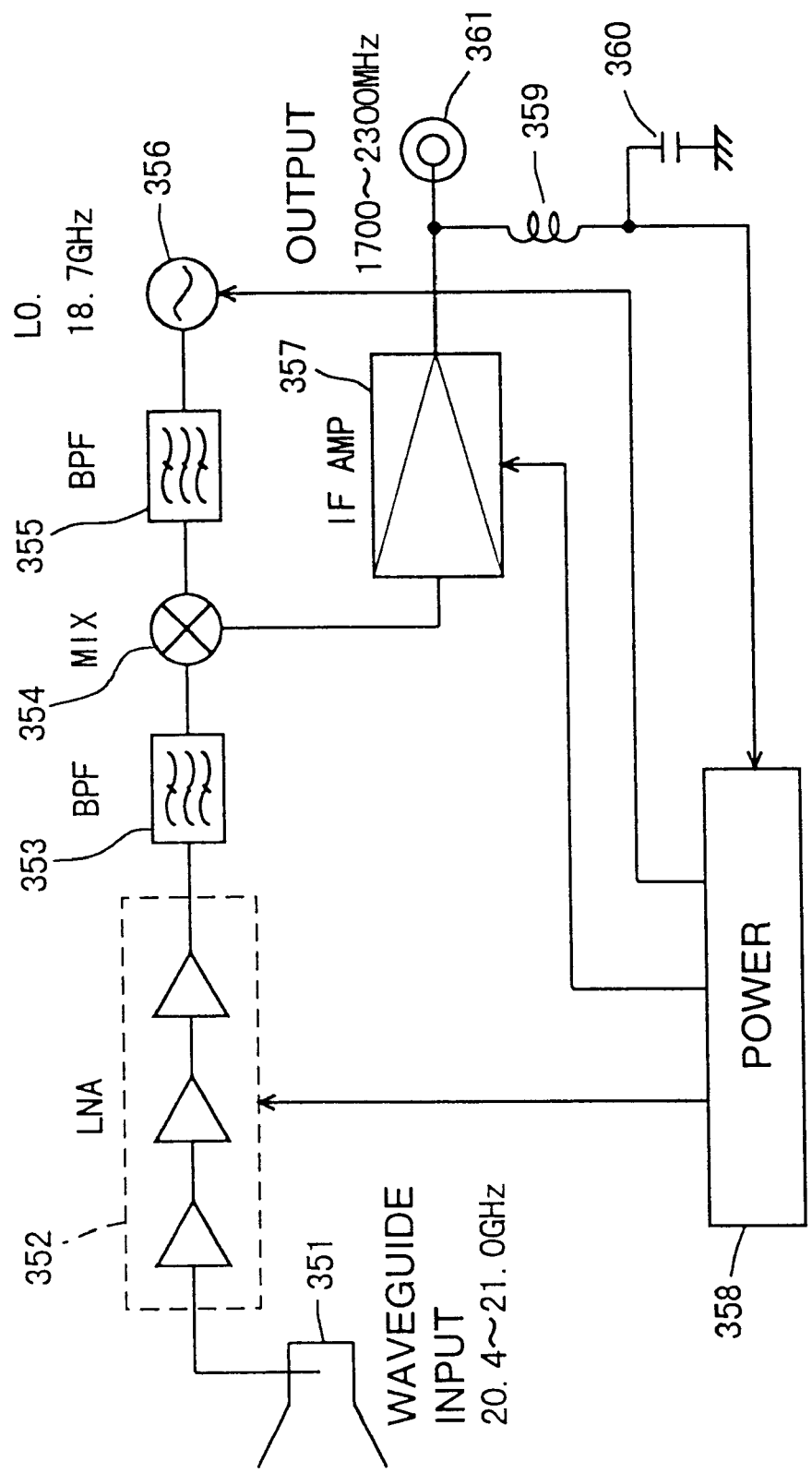
FIG. 14 is a schematic block diagram of an LNB for receiving the Ka band.
Figure 15:
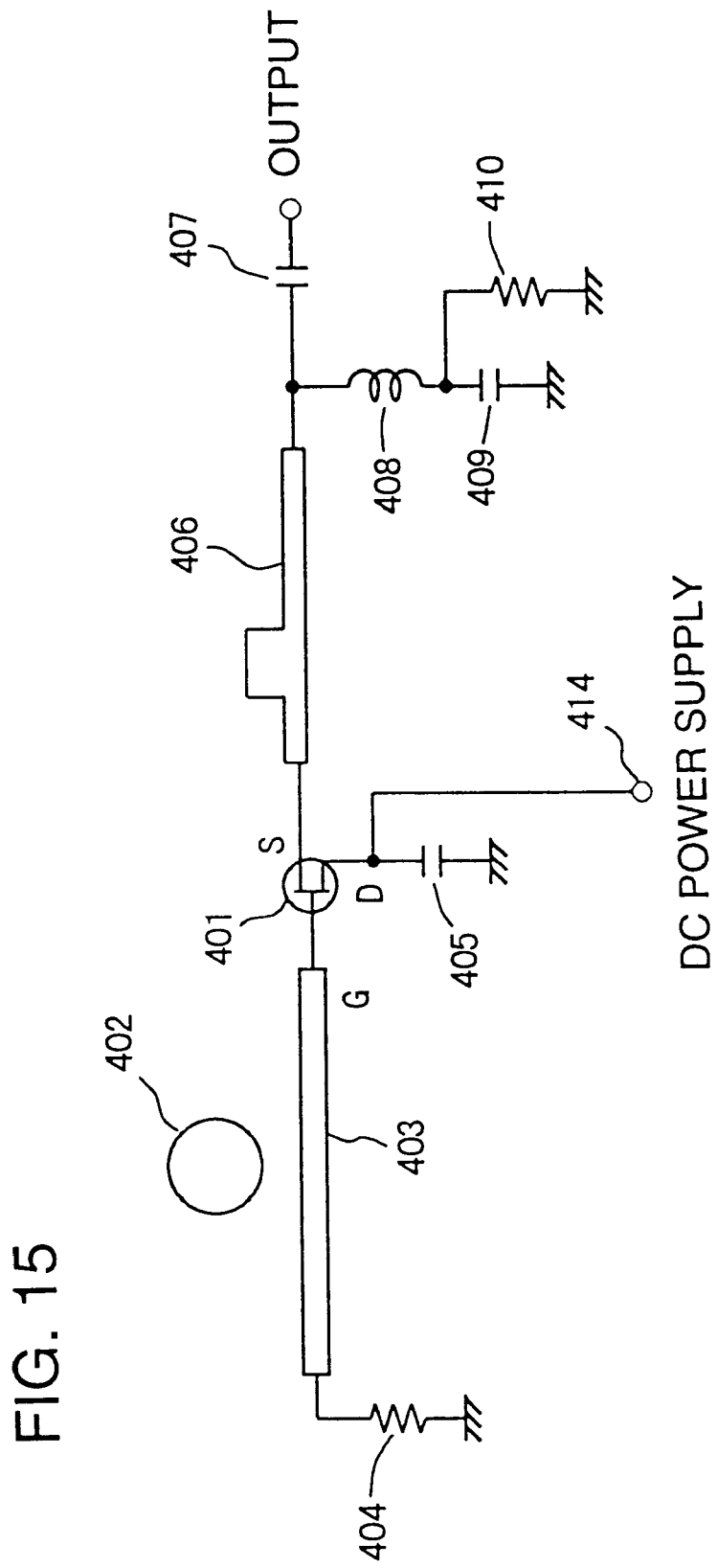
FIG. 15 is a diagram of a circuit which may be employed as a local oscillator for use in an LNB for receiving the Ka band.

Similarly, when an HEMT with a single drain terminal is used, the circuit pattern of the modification of the local oscillator according to the second embodiment can be corrected to improve the oscillation characteristic. Referring to FIG. 10, HEMT 170 has one drain terminal D1, and the shape of high impedance line 106 is formed to have a U shape. A wire 401 connects two positions of high impedance line 106 so as to cross the space surrounded by high impedance line 106.

Therefore, the modification of the local oscillator according to the third embodiment using an HEMT having a single drain terminal can alleviate the assembling operation and reduce the manufacturing cost in addition to the previously described effects.

In the local oscillators according to the first to third embodiments described above, the circuit is formed on a single substrate. Therefore, the local oscillator can be formed on the same substrate on which LNA, MIX and BPF forming the circuit of the LNB are formed. As a result, the assembling operation of LNB can be eliminated, and connectors to connect the circuits of these elements are not necessary, which improves the productivity and reduces the manufacturing cost.

In addition, oscillation elements can be selected independently of the number of drain terminals, a wider variety of such elements can be selected, the flexibility of design increases, and the cost for parts can be reduced.

The pattern diagrams shown in FIGS. 2, 4, 6, 8 and 9 are basic patterns optimized on a single substrate, and the present invention is not limited to these patterns.

Furthermore, the local oscillators used for receiving the Ka band has been described in the embodiments, it is understood that the present invention is applicable to local oscillators used for receiving the Ku band. The HEMT is preferably used for the oscillation element, but a Hetero Bipolar Transistor (HBT) or an FET may also be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A local oscillator comprising:
a high electron mobility transistor (HEMT) operating as an oscillation element wherein the HEMT includes two drain terminals;
a bias circuit having one end connected to a power supply and another end connected to a drain terminal of said oscillation element; and
a printed circuit board, said oscillation element and said bias circuit being provided on the printed circuit board,
said bias circuit including a first stub and a chip capacitor for grounding, and a high impedance line for blocking relatively high frequency components of received signals.

2. The local oscillator according to claim 1, wherein said first stub for grounding and said chip capacitor of said bias circuit are connected through said high impedance line.

3. The local oscillator according to claim 1, wherein the entire circuit of the local oscillator is provided on said printed circuit board.

4. A local oscillator comprising:
an oscillation element having two drain terminals,
a bias circuit having one end connected to a power supply and another end connected to a first drain terminal of said oscillation element, and
a stub for grounding, connected to a second drain terminal of said oscillation element.

5. The local oscillator according to claim 4, wherein said oscillation element is provided between said bias circuit and said stub for grounding.

6. An antenna unit comprising the local oscillator according to claim 1.

7. A local oscillator, comprising:
an oscillation element includes two drain terminals;
a bias circuit having one end connected to a power supply and another end connected to a drain terminal of said oscillation element,
said bias circuit including an impedance line with a U-shaped pattern.

8. The local oscillator according to claim 7, wherein said impedance line in said bias circuit is connected at two positions by a wire.

9. An antenna unit including a local oscillator, said local oscillator, comprising:
an oscillation element having two drain terminals;
a bias circuit having one end connected to a power supply and another end connected to a first drain terminal of said oscillation element; and
a stub for grounding, connected to a second drain terminal of said oscillation element.

10. The antenna unit according to claim 9 wherein said oscillator and bias circuit are provided on a printed circuit board.

11. The local oscillator of claim 4, wherein said oscillation element is a high electron mobility transistor (HEMT).

12. The local oscillator of claim 4, wherein said oscillation element is one of an HBT and a FET.

13. The local oscillator of claim 4, wherein the bias circuit further includes:
a stub and a chip capacitor for grounding; and
a high impedance line for blocking relatively high frequency components of received signals.

14. The local oscillator of claim 4, wherein the oscillator element, bias circuit and stub are provided on a printed circuit board.

15. An antenna unit comprising the local oscillator of claim 4.

16. The antenna unit of claim 9, wherein said oscillation element is a high electron mobility transistor (HEMT).

17. The antenna unit of claim 9, wherein said oscillation element is one of an HBT and a FET.

18. The antenna unit of claim 9, wherein the bias circuit further includes:
a stub and a chip capacitor for grounding; and
a high impedance line for blocking relatively high frequency components of received signals.

* * * * *